United States Patent [19]

Smither

[11] 4,158,819
[45] Jun. 19, 1979

[54] INSTANTANEOUS FLOATING POINT AMPLIFIER

[75] Inventor: Miles A. Smither, Houston, Tex.

[73] Assignee: Geosource Inc., Houston, Tex.

[21] Appl. No.: 921,599

[22] Filed: Jul. 3, 1978

Related U.S. Application Data

[63] Continuation of Ser. No. 749,218, Dec. 10, 1976, Pat. No. 4,014,596.

[51] Int. Cl.² .............................................. H03G 3/20
[52] U.S. Cl. .......................................... 330/9; 330/51; 330/151
[58] Field of Search ................. 330/86, 127, 129, 144, 330/145, 9, 51, 151; 340/15.5 GC

[56] References Cited

U.S. PATENT DOCUMENTS

| 3,139,590 | 6/1964 | Brown | 330/51 X |
|---|---|---|---|
| 3,241,100 | 3/1966 | Loofbourrow | 340/15.5 GC |
| 3,264,574 | 8/1966 | Loofbourrow | 330/51 |
| 3,315,223 | 4/1967 | Hibbard et al. | 340/15.5 GC |
| 3,449,685 | 6/1969 | Holmes | 330/51 X |
| 3,562,744 | 2/1971 | Howlett | 340/15.5 GC |
| 3,603,972 | 9/1971 | Vanderford | 340/347 AD |
| 3,636,463 | 1/1972 | Ongkiehong | 330/151 X |
| 3,671,931 | 6/1972 | Loofbourrow | 340/15.5 GC |
| 3,673,398 | 6/1972 | Loofbourrow | 340/347 DA X |
| 3,688,250 | 8/1972 | Howlett | 340/15.5 GC |
| 3,699,325 | 10/1972 | Montgomery, Jr. et al. | 340/347 AD X |
| 3,700,871 | 10/1972 | Montgomery, Jr. et al. | 235/154 |
| 3,813,609 | 5/1974 | Wilkes | 330/51 |
| 3,872,465 | 3/1975 | Loofbourrow | 340/347 DA |
| 3,919,657 | 11/1975 | Howlett et al. | 330/51 |
| 3,919,685 | 11/1975 | Haill | 340/15.5 GC |
| 4,031,504 | 6/1977 | Mioduski | 330/86 X |
| 4,064,480 | 12/1977 | Howlett | 340/15.5 GC |
| 4,091,380 | 5/1978 | Yu | 330/86 X |

FOREIGN PATENT DOCUMENTS

| 1549197 | 3/1967 | France | 330/9 |
|---|---|---|---|
| 6502149 | 8/1966 | Netherlands | 330/51 |

Primary Examiner—James B. Mullins
Attorney, Agent, or Firm—Arnold, White & Durkee

[57] ABSTRACT

An improved instantaneous floating point amplifier is provided having a plurality of cascaded amplifier stages, wherein the gain of a given stage of the amplifier is the square of the gain of the immediately succeeding stage of the amplifier. The number of amplifier stages which are required to implement the amplifier is minimized, and the control logic which is required to decide if a given stage is needed to amplify the input signal to a level within preselected limits is simplified. The amplifier has an automatic nulling feature which permits nulling of the amplifier without loss of data.

8 Claims, 6 Drawing Figures

INSTANTANEOUS FLOATING POINT AMPLIFIER

CROSS-REFERENCE TO RELATED APPLICATION

This application is a continuing application of U.S. patent application Ser. No. 749,218, filed Dec. 10, 1976 and now U.S. Pat. No. 4,104,596.

BACKGROUND OF THE INVENTION

1. Field of the Invention

This invention relates to instantaneous floating point amplifiers which amplify a fluctuating input signal to a level within preselected limits.

2. Description of the Prior Art

In seismic exploration, sound waves are commonly used to probe the earth's crust as a means of determining the types and location of subsurface formations. The earth's crust can be considered a transmission medium or filter whose characteristics are to be determined by passing sound waves through that medium. In the reflection seismic method, sound waves or impulses are generated at a transmission point at or near the earth's surface, and sound waves reflected from subsurface reflecting boundaries are received at one or more receiving points. The received waves are detected by seismic detectors, e.g., geophones, which generate electrical signals at their outputs. Information relating to subsurface formations is contained in these signals, and they are recorded in a form which permits analysis. Skilled interpreters can discern from the analysis the shape and depth of subsurface reflection boundaries and the likelihood of finding an accumulation of minerals, such as oil and gas.

In a typical seismic field recording system, the seismic detectors are arranged in arrays or nests. The outputs of these arrays are time-division multiplexed, amplified, digitized, and recorded. In a typical time-division multiplexed system, the output of each array is sampled once per sample time, and it is common for the sample time to be one millisecond, two milliseconds, or four milliseconds.

The amplification of the output of a seismic detector array is complicated in that the amplitude of the input sound wave varies as a function of time. Additionally, the amplitude of the reflected sound waves decreases with time, because recording is typically continued after the generation of input sound waves is terminated. Accordingly, it is undesirable in seismic operations to utilize an amplifier having a fixed gain.

The amplifier which has commonly been utilized to amplify the output of a seismic array is known as an instantaneous floating point amplifier. The gain of this type of amplifier varies depending upon the magnitude of the input signal, and the amplifier is usually designed to apply a gain to this input such that the amplifier output, when sampled, is at a level within preselected limits. Typically, the amplifier is designed to amplify the input signal to a level between one-half and full scale output of the amplifier.

A typical instantaneous floating point amplifier includes a plurality of cascaded amplifier stages, and the number of stages and the gain of each stage determine the maximum gain that the amplifier can apply to the signal presented at its input. A given stage of the amplifier may or may not be used, depending upon the amount of gain that must be applied to the input signal to amplify it within the preselected limits.

A typical instantaneous floating point amplifier also includes control circuitry which determines, for each input signal, those stages of amplification which are required to amplify the input signal to within the preselected limits. This control circuitry typically generates a gain word which is representative of which stages of the amplifier are presently being utilized to amplify the input signal. Of course, as the number of stages of amplification in the amplifier increases, the generation of the gain word becomes more complex. It is, therefore, desirable to minimize the number of stages of amplification which are required to implement a given amplifier.

Another problem with prior art instantaneous floating point amplifiers is that each stage of amplification has an inherent offset voltage which is amplified together with the input signal. Since it is imperative that the ultimately recorded data be as uncorrupted by noise as possible, this amplified offset voltage must be removed from the amplifier output before later processing begins. This technique of removing the offset voltage has commonly been referred to as "nulling the amplifier."

Prior art amplifier systems typically employ rather complex circuitry to correct for the offset or employ a nulling technique which disables the amplifier for nulling while data is being received. This latter technique can, of course, result in a loss of valuable data.

The instantaneous floating point amplifier of the present invention overcomes these and other shortcomings of the prior art in the manner hereinafter described.

SUMMARY OF THE INVENTION

An improved floating amplifier is provided which comprises a plurality of n cascaded amplifier stages, where the gain, $A_i$, of the i th stage of amplification is given by the expression $A_i = (A_{i-1})^2$, for $i = 2, 3, \ldots, n$, and where $A_1$, is the gain of the stage having the least gain of the n stages. Control circuitry is provided for sequentially enabling each stage of the amplifier and for determining if that amplifier stage should be utilized to amplify the input signal to a level within the preselected limits. A level detector is coupled to the output of the cascaded amplifier stages and produces an output signal indicative of the voltage level of the signal at the output of the amplifier stages. The control circuitry responds to the signal at the output of the level detector by generating signals to retain or bypass each amplifier stage.

An instantaneous floating point amplifier according to the present invention also provides for automatic nulling of the amplifier. This is accomplished by including a capacitor in series with the output of each stage of amplification. This capacitor charges to a value equal to the gain of the stage times the offset voltage of the stage when the stage is not enabled to amplify the input signal. When the stage is enabled to amplify the input signal, the signal appearing at the output of the amplifier stage is automatically corrected for the offset voltage.

DESCRIPTION OF THE PREFERRED EMBODIMENT

It will be appreciated that the present invention can take many forms and embodiments. A preferred embodiment of the invention is described so as to give an understanding of the invention. It is not intended, however, that this illustrative embodiment should in any way limit the true scope and spirit of the invention.

The preferred embodiment of the present invention includes a number of switch elements for connection and disconnection of each stage of amplification employed in the amplifier. The type of switch element which is employed in this preferred embodiment includes first and second FET switches and a gating input. The logic value of the signal on the gating input controls the operation of the two FET switches, and, when the logic value of the gating input is a logic 1, the first switch is closed and the second switch is open. Conversely, when the logic value of the gating input is a logic 0, the first switch opens and the second switch closes. Each switch element in the illustrated embodiment of the instantaneous floating point amplifier of the present invention is preferably a Model DG-188, which is manufactured by Siliconix, Inc.

Figure 1:
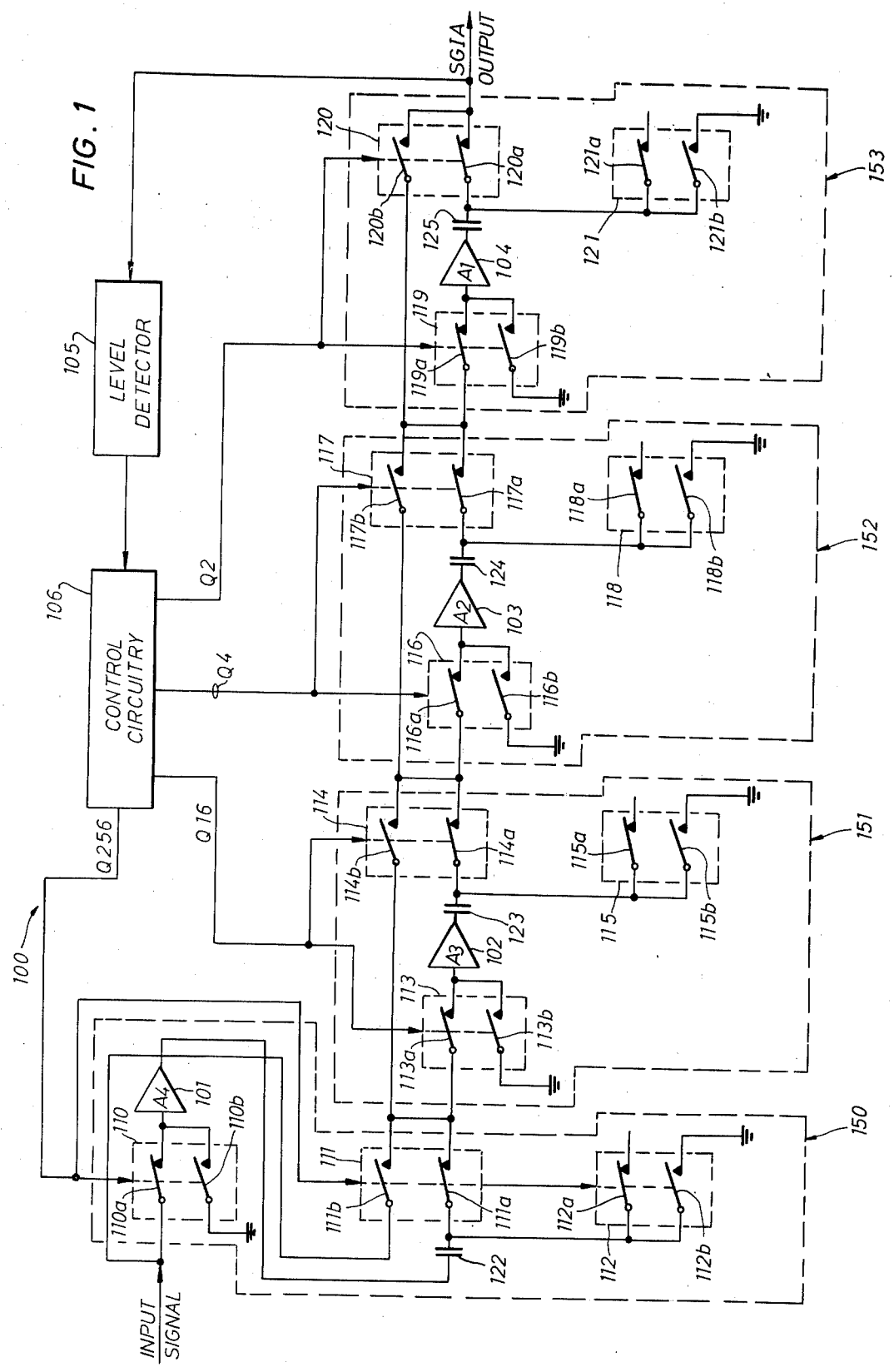
FIG. 1 is an electrical schematic in block diagram form of an embodiment of a floating point amplifier according to the present invention.

Referring now to FIG. 1, an embodiment of instantaneous floating point amplifier 100 in accordance with the present invention comprises amplifier stages 150-153, level detector 105, and control circuitry 106. Amplifier stages 150-153 are connected in a cascaded arrangement, as shown, and the signal to be amplified is connected to the input of amplifier stage 150. The output of amplifier stage 153 is connected to the input of level detector 105, and the output of level detector 105 is connected to the input of control circuitry 106. The outputs of control circuitry 106, which are designated Q256, Q16, Q4, and Q2, are control signals for controlling the operation of the switch elements in the respective amplifier stages 150-153 and are connected to the gating input of each switch element in the respective amplifier stages.

The gains of the amplifier stages of the instantaneous floating point amplifier of the present invention are chosen in accordance with the following criteria: If the amplifier stage having the lowest gain of all stages is designated as $A_1$ and if there are n cascaded stages, the gain, $A_i$, of the i th stage is given by the expression $A_i=(A_{i-1})^2$ for $i=2, 3, \ldots, n$. In the preferred embodiment of the present invention $n=4$ and the gain, $A_1$, of amplifier stage 153 equals 2, and, accordingly, gains $A_2-A_4$ are 4, 16, and 256, respectively.

The gain of amplifier stage 153, which is two in the preferred embodiment of the present invention, determines the resolution of amplifier 100. With this gain, the resolution of amplifier 100 is one bit.

The operation of instantaneous floating point amplifier 100 is described by assuming that the beginning of a sample time has just occurred. At this time, each signal Q256, Q16, Q4, and Q2, is a logic 0. Control circuitry 106 first brings control signal Q256 to a logic 1 level and keeps control signals Q16, Q4, and Q2, at a logic 0 level. Under these conditions, switches 110a, 111a, 113b, 114b, 116b, 117b, 119b, and 120b, are closed. Hence, amplifiers 102-104 in amplifier stages 151-153, respectively, are bypassed and the signal appearing at the point designated SGIA OUTPUT is the input signal amplified by the gain of operational amplifier 101 in amplifier stage 150.

Level detector 105 compares the voltage level of SGIA OUTPUT to a preselected threshold voltage, and generates an output signal based upon this comparison. If the voltage level of SGIA OUTPUT exceeds the preset threshold, the gain of amplifier stage 150 is not required to amplify the input signal to within the preselected limits. Level detector 105 indicates this fact by generating a signal at its output having a logic 0 level. If, however, this signal on the input of level detector 105 does not exceed this threshold value, the gain of amplifier stage 150 is required to amplify the input signal to a level within the preselected limits. Under these conditions, therefore, the output signal of level detector 105 is a logic 1.

Control circuitry 106 responds to the logic level of the signal at the output of level detector 105. If the gain of amplifier stage 150 is not required to amplify the input signal to a level within the preselected limits, the logic level of control signal Q256 is returned to a logic 0 by control circuitry 106. Under these conditions, switches 110a, 111a, and 112a open, switches 110b, 111b, and 112b close, and the input of operational amplifier 101 and one terminal of capacitor 122 are connected to ground. Amplifier stage 150 is bypassed, since the input signal is connected via switch 111b to the input of amplifier stage 151.

If, however, amplifier stage 150 is required to amplify the input signal to a level within the preselected limits, control circuitry 106 keeps control signal Q256 at a logic 1 level, and the gain of amplifier stage 150 will thereafter be applied to the input signal for this channel sample time.

Control circuitry 106 then sequentially enables control signals Q16, Q4, and Q2, to determine if amplifier stages 151-153, respectively, are required to amplify the input signal to a level within the preselected limits. The above-described comparison by level detector 105 and the response to control circuitry 106 to this comparison are sequentially repeated for each control signal Q16, Q4, and Q2. When this process is completed, the signal designated as SGIA OUTPUT has been amplified to a level within the preselected limits of the output of the amplifier.

In view of the foregoing,, the phrase "amplifier stage," as used herein, includes not only the respective amplifiers 101-104, but also the respective switches for enabling or by-passing an amplifier. Therefore, while the amplifier stages herein are in cascade, the amplifiers, e.g., 101-104, are not necessarily in cascade. Accordingly, an instantaneous floating point amplifier according to the present invention differs in both structure and operation from prior art systems in which the amplifiers are connected in cascade [For example, see U.S. Pat. No. 3,241,100 to Loofbourrow].

As described above, a typical instantaneous floating point amplifier includes circuitry which generates a gain word for each input signal. This gain word represents the amount of gain which the instantaneous floating point amplifier applied to the input signal to bring it to a level within the preselected limits. It will be observed that the squared increments of gain between amplifier stages enable gains to be applied to the input signal in factors of two, from a gain of one to a gain of $2^{15}$. Accordingly, the final logic values of control signals Q256, Q16, Q4, and Q2, for each sample form the gain word for that sample. Hence, the instantaneous floating point amplifier of the present invention generates this gain word without the necessity of employing additional decoding logic to form the gain word.

Upon the completion of the process described above, the output signal SGIA OUTPUT may then be digitized by a conventional analog-to-digital converter (not shown), and further processing of the digitized signal, together with its gain word, may then be accomplished. Since the analog-to-digital conversion of a given output signal may not be completed before the beginning of the next input signal to be amplified, control circuitry 106 preferably includes a storage device to retain the logic values of control signals Q256, Q16, Q4, and Q2 for the previous sample.

Before the input signal from the next channel becomes available, control circuitry 106 operates to reset the logic level of each control signal Q256, Q16, Q4, and Q2, to a logic 0 value. At this time the input of each amplifier 101-104 in amplifier stages 150-153, respectively, is connected to ground and one terminal of nulling capacitors 122-125 is connected to ground via switches 112b, 115b, 118b, and 121b, respectively. Hence, the voltage appearing at the output of each amplifier 101-104 is equal to the gain of that amplifier times the respective offset voltage of that amplifier. Accordingly, the voltage across nulling capacitors 122-125 charges to this voltage appearing at the output of its respective amplifier.

Each amplifier 101-104 is preferably connected in a configuration such that its input impedance is very high. As described in more detail below, this configuration is preferably the non-inverting operational amplifier configuration. Likewise, level detector 105 is designed such that its input impedance is very high.

When one or more stages of amplification 150-153 are enabled, the voltage at the output of the amplifier in each enabled stage is given by the expression: amplifier gain X (input signal + amplifier offset voltage). Since the second terminal of the nulling capacitor is always connected to a very high input impedance when the amplifier stage is enabled, the voltage across a given nulling capacitor (amplifier gain times amplifier offset voltage) does not change significantly. Accordingly, for each enabled stage of amplification, the voltage appearing at the second terminal of the nulling capacitor i.e., the output of the stage of amplification, is the amplifier gain times the input voltage. It is observed, therefore, that the instantaneous floating point amplifier of the present invention automatically nulls each stage of amplification whenever that stage is not enabled. This is a significant feature of the instantaneous floating point amplifier of the present invention, since valuable data is not lost when the amplifier is nulled.

Figure 2:
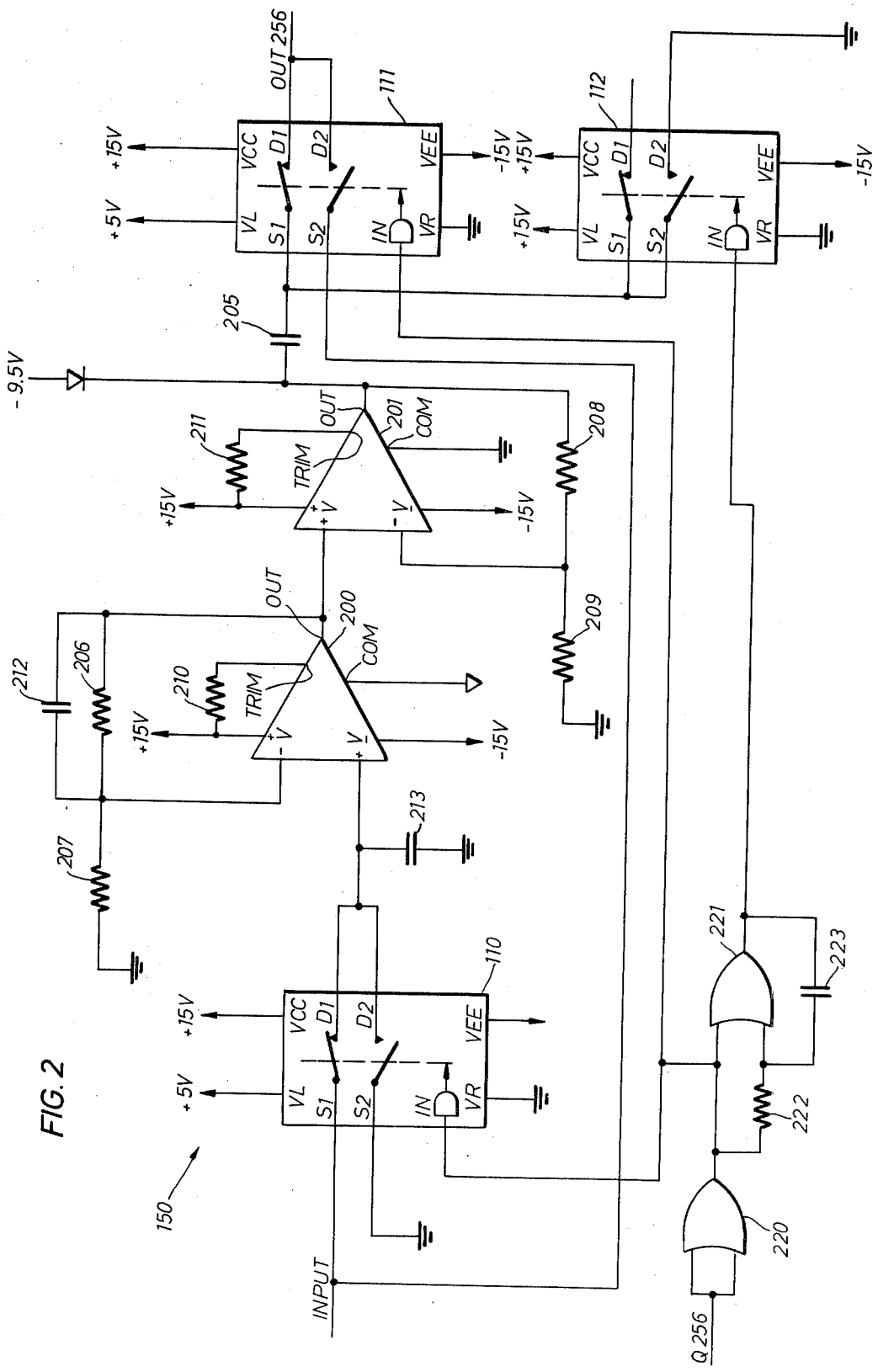
FIG. 2 is an electrical schematic diagram of the preferred embodiments of amplifier stage 150 of FIG. 1 and a portion of the control circuitry of FIG. 1.

Now referring to FIG. 2, a preferred embodiment of amplifier stage 150 of FIG. 1 comprises operational amplifiers 200 and 201, switch elements 110-112, nulling capacitor 205, resistors 206-211, and capacitors 212 and 213, all connected as shown.

Operational amplifiers 200 and 201, together with resistors 206-209, are each arranged in a non-inverting configuration. It is well known that the closed loop gain of the non-inverting configuration including operational amplifier 200 and resistors 206 and 207 is given by the expression:

$$1 + \frac{\text{value of resistor 206}}{\text{value of resistor 207}};$$

and that the value of the closed loop gain of the non-inverting configuration comprising operational amplifier 201 and resistors 208 and 209 is given by the expression:

$$1 + \frac{\text{value of resistor 208}}{\text{value of resistor 209}}.$$

In the preferred embodiment of the instantaneous floating point amplifier of the present invention, the values of resistors 206 and 208 are 3,000 ohms and the values of resistors 207 and 209 are 200 ohms. Hence, the closed loop gain of each amplifier configuration is 16, thereby resulting in an overall gain for amplifier stage 150 of 256. The tolerance of each resistor 206-209 is preferably ±0.005%, in order that the gain of amplifier stage 150 is very precise.

Also illustrated in FIG. 2 is a portion of control circuitry 106 which comprises OR gates 220 and 221, registor 222, and capacitor 223, all connected as shown. OR gate 220 provides buffering for control signal Q256, and the logic value of the output of OR gate 220 is identical to the logic value of control signal Q256. The combination of OR gate 221, resistor 222, and capacitor 223 operate to delay the signal presented to switches 111 and 112 when control signal Q256 changes from a logic 1 to a logic 0 value. The delay allows the output of operational amplifiers 200 and 201 to reduce to a level equal to the amplifier gain times the offset voltage of the respective amplifiers. Accordingly, the voltage across capacitor 205 is this value when the logic level of the output of OR gate 221 changes from a logic 1 to a logic 0. Since one terminal of capacitor 205 is connected to ground via switch 112b when control signal Q256 is a logic 0, the delay in application of this logic 0 is provided to prevent charging capacitor 205 to a value other than the amplifier gain times the offset voltage.

Figure 3:
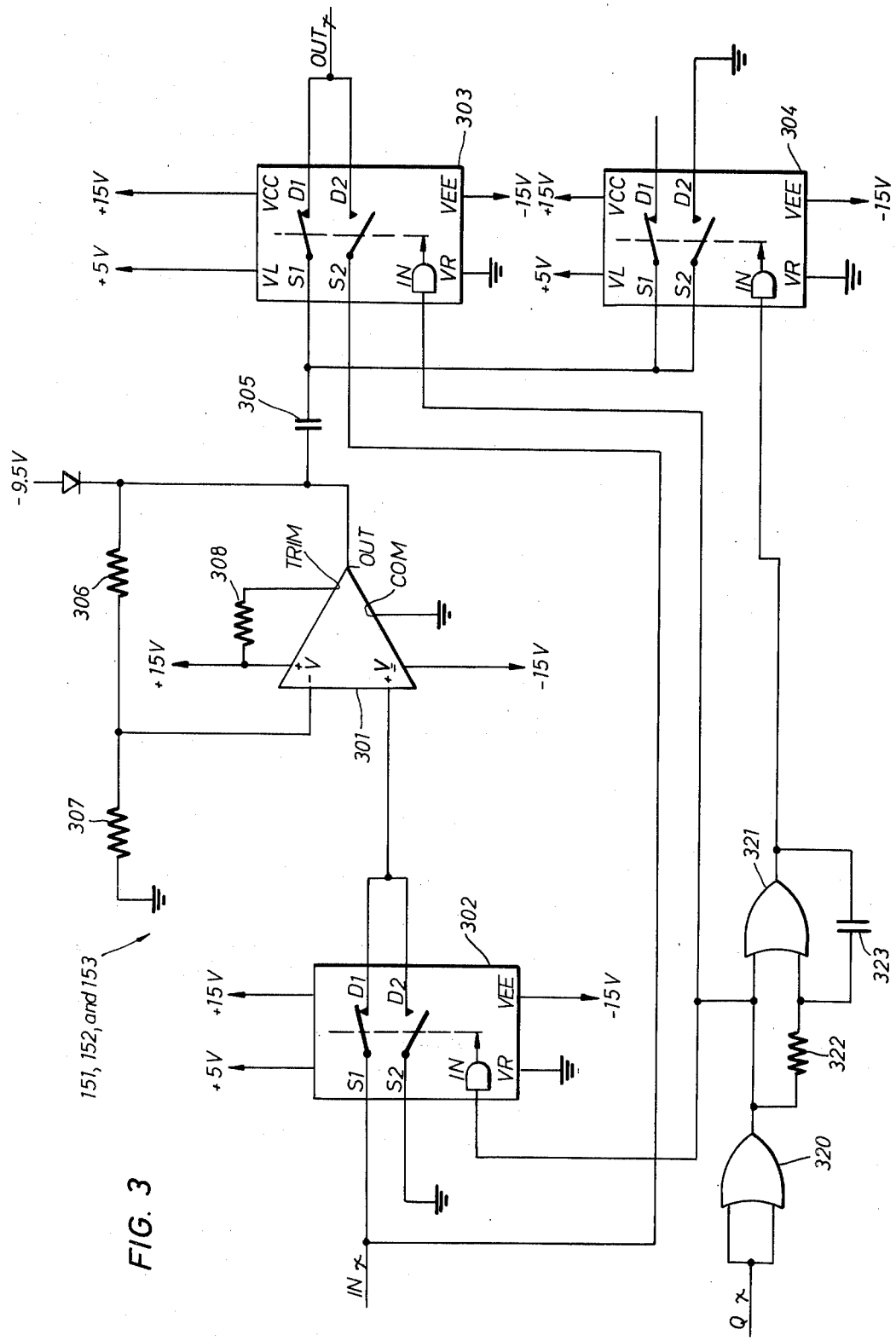
FIG. 3 is an electrical schematic diagram of the preferred embodiments of amplifier stages 151, 152, and 153 of FIG. 1 and a portion of the control circuitry of FIG. 1.

The values and/or types of the components in FIG. 3 not heretofore described are:
  operational amplifiers 200 and 201: 3401B;
  OR gates 320 and 321: 7432;
  resistors 210 and 211: 261 ohms;
  capacitor 212: 47 pfd;
  resistor 222: 2,000 ohms; and
  capacitor 223: 0.001 mfd.

Now referring to FIG. 3, there is illustrated a preferred embodiment of the amplifier configuration which is utilized to implement each amplifier stage 151-153. This embodiment comprises operational amplifier 301, switch elements 302-304, capacitor 305, and resistors 306-308, all connected as shown.

Operational amplifier 301, together with resistors 306 and 307, are connected in a non-inverting amplifier configuration, and the gain of this configuration is given by the expression:

$$1 + \frac{\text{value of resistor 306}}{\text{value of resistor 307}}.$$

The value of resistor 307 and amplifier stage 151 is 200 ohms, the value of resistor 307 in amplifier stage 152 is 1,000 ohms, and the value of resistor 307 in amplifier stage 153 is 3,000 ohms. In each amplifier stage 151–153, the value of resistor 306 is 3,000 ohms, resulting in amplifier stages 151–153 having gains of 16, 4, and 2, respectively. The tolerance of resistors 306 and 307 in each amplifier stage 151–153 is preferably ±0.005%.

Also illustrated in FIG. 3 is a portion of control circuitry 106 which comprises OR gates 320 and 321, resistor 322, and capacitor 323, all connected as shown. These components provide the function of gating the respective control signal, i.e. Q16, Q4, or Q2 to the respective switches. In amplifier stages 151–153, control signal $Q_x$ is control signal Q16, Q4, and Q2, respectively. The input signal designated in $IN_x$ is the output of amplifier stage 150, the output of amplifier stage 151, and the output of amplifier stage 152, in each amplifier stage 151–153, respectively. The signal designated in $OUT_x$ is the output of each amplifier stage 151–153 and, in amplifier 153, signal $OUT_x$ is the signal designated as SGIA OUTPUT in FIG. 1.

The values and/or types of components in FIG. 3 not heretofore described are:
 operational amplifier 301: 3401B;
 OR gates 320 and 321: 7432;
 resistor 308: 261 ohms;
 resistor 322: 2,000 ohms; and
 capacitor 323: 0.001 mfd.

Figure 4:
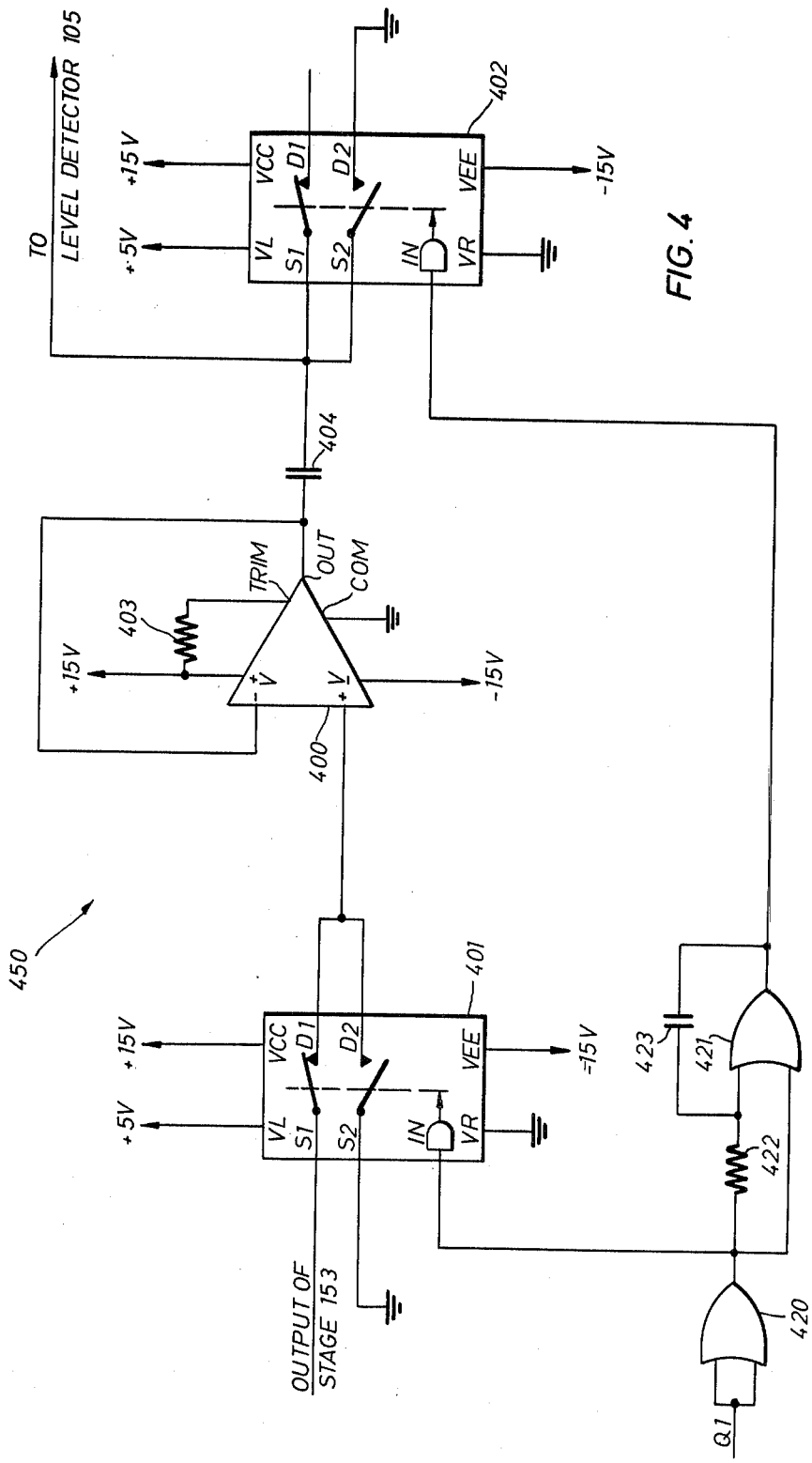
FIG. 4 is an electrical schematic diagram of the preferred embodiments of a unity gain amplifier and a portion of the control circuitry of FIG. 1.

Referring now to FIG. 4, the preferred embodiment of the instantaneous floating point amplifier of the present invention also comprises unity gain amplifier 450 which is connected between the output of amplifier stage 153 and the input of level detector 105. Since it is desirable that the output impedance of the amplified signal be as low as possible and since the switch in the switch element employed at the output of amplifier stage 153 has a finite resistance, unity gain amplifier 450 operates to provide a low output impedance signal to the input of level detector 105.

Unity gain amplifier 450 comprises operational amplifier 400, switches 401 and 402, resistor 403, and capacitor 404, all connected as shown in FIG. 4. Also illustrated in FIG. 4 is a portion of control circuitry 106 for controlling the operation of switch elements 401 and 402. This portion of control circuitry 106 comprises OR gates 420 and 421, resistor 422, and capacitor 423, all connected as shown. Switch 402 is provided to insure that the offset voltage of operational amplifier 400 is removed from the signal presented to the input of level detector 105.

Figure 6:
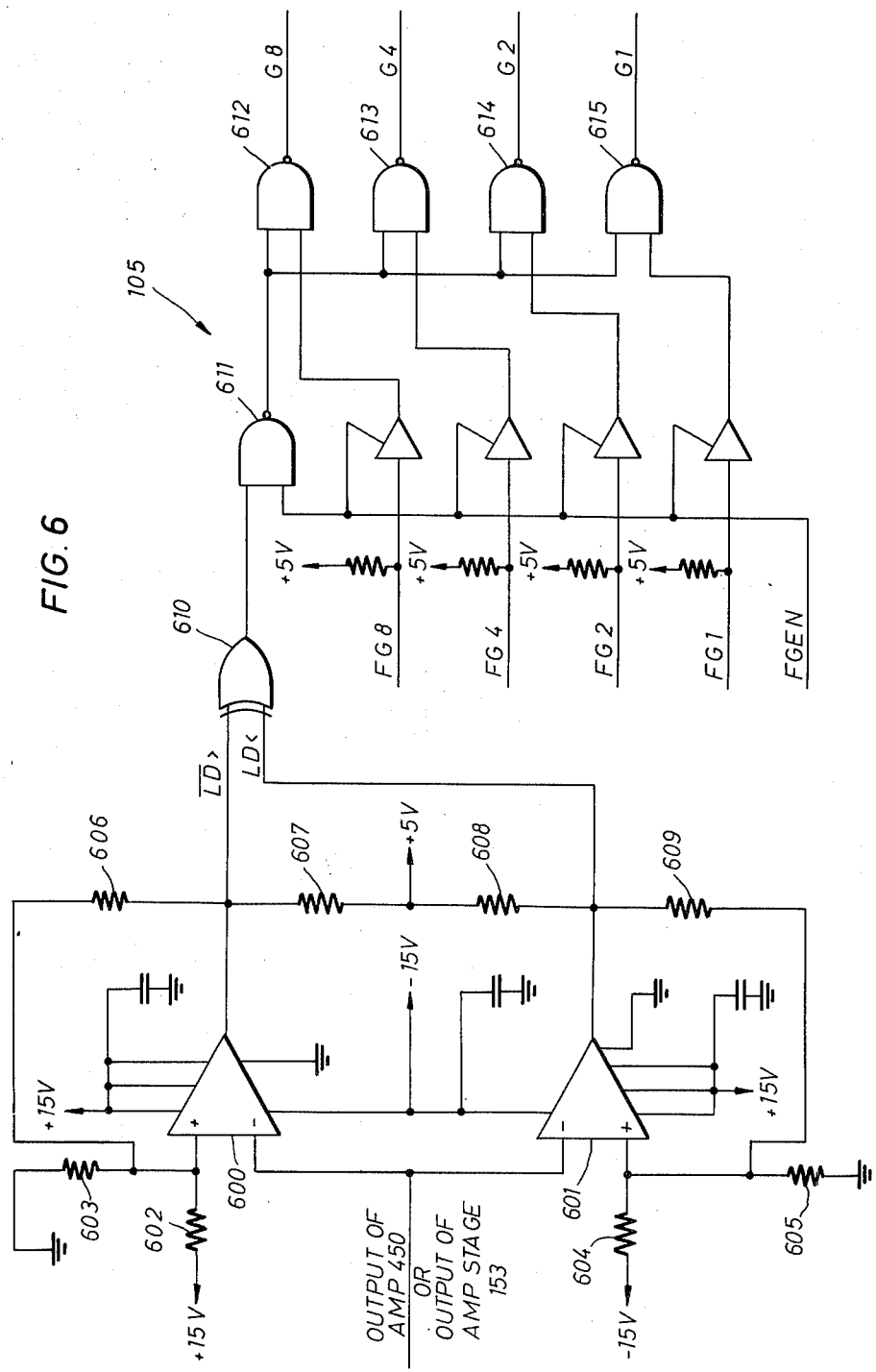
FIG. 6 is an electrical schematic diagram of the preferred embodiments of the level detector of FIG. 1 and another portion of the control circuitry of FIG. 1.

Now referring to FIG. 6, the preferred embodiment of level detector 105 includes comparators 600 and 601, resistors 602–609, exclusive-or (EXOR) gate 610, and NAND gates 611–615, all connected as shown.

In seismic operations, as well as other operations, the fluctuating input signal will have both positive and negative values. Since the polarity of the input signal to be amplified is not changed after amplification, i.e., non-inverting amplifier configurations are used, signals of both positive and negative polarities will appear at the input to level detector 105. Accordingly, comparator 600 is provided to determine if positive input signals exceed a preselected threshold, while comparator 601 is provided to determine if negative input signals are more negative than a preselected negative threshold.

It is preferrable to connect the input signal to level detector 105 to the inverting inputs of comparators 600 and 601. Each comparator 600 and 601 provides a logic 1 level (+5 volts) at its output when the voltage on the non-inverting input is more positive than the voltage on the inverting input and a logic 0 level (0 volts) at its output when the voltage on the non-inverting input is less positive than the voltage on the inverting input. Accordingly, the output, $\overline{LD>}$, of comparator 600 is a logic 1 and the output, LD<, of comparator 601 is a logic 0, when the voltage level of the input signal to level detector 105 is between the voltages on the non-inverting inputs of comparators 600 and 601.

As shown, the serial combination of resistor 602 and 603 are connected between plus 15 volts and ground, and the common connection of these two resistors is connected to the non-inverting input of comparator 600. Resistor 606 is connected between the non-inverting input and the output of comparator 600. In the preferred embodiment of level detector 105, the values of resistors 602, 603, and 606 are 44.2 K ohms, 63.4 K ohms, and 100 K ohms respectively. The above values of resistance dictate that the voltage on the non-inverting input of comparator 600 is approximately 8.04 volts, when the output of comparator 600 is a logic 1. Accordingly, the output of comparator 600 remains at a high logic level as long as the voltage level on the inverting input is less positive than this preselected threshold of 8.04 volts. When the voltage on the inverting is more positive than 8.04 volts, the output of comparator 600 becomes a logic 0. At this time, the voltage at the non-inverting input of comparator 600 is approximately 7.01 volts. The output of comparator 600 remains, therefore, at a logic 0 level until the input voltage to level detector 105 becomes less positive than 7.01 volts. At this time, the output of comparator 600 becomes a logic 1.

Still referring to FIG. 6, the serial combination of resistors 604 and 605 is connected between −15 volts and ground, and the point of common connection between resistors 604 and 605 is connected to the non-inverting input of comparator 601. Resistor 609 is connected between the output and the non-inverting input of comparator 601. In the preferred embodiment of level detector 105, the values of resistors 604, 605, and 609 are 39.2 K ohms, 84.5 K ohms, and 100 K ohms respectively. These values of resistance dictate that the voltage on the non-inverting input of comparator 601 is approximately −8.08 volts, when the output of comparator 601 is a logic zero. As long as the signal on the inverting input of comparator 601 is more positive than this preselected threshold of −8.08 volts, the output of comparator 601, remains a logic 0. When the signal on the inverting input of comparator 601 is more negative than −8.08 volts, the output of comparator 601 becomes a logic 1. At this time, the voltage on the non-inverting input of comparator 601 is approximately −7.03 volts. The output of comparator 601 remains, therefore, at a logic 1 level until the input voltage to level detector 105 becomes more positive than −7.03 volts. At this time, the output of comparator 601 becomes a logic 0.

In the preferred embodiment of the present invention, each comparator 600 and 601 is an LM 3111H, such as manufactured by National Semiconductor.

Still referring to FIG. 6, the outputs of comparators 600 and 601 are connected to the inputs of EXOR gate 610. The Boolean switching function realized at the output of EXOR gate 610 is a logic 0 when the inputs have the same logic value and is a logic 1 when the inputs have different logic values. Accordingly, the output of EXOR gate 610 is a logic 1, as long as the voltage level of the input signal to level comparator 105 is between the preselected thresholds of 8.04 volts and −8.08 volts. When the input signal is more positive than 8.04 volts or more negative than −8.08 volts, the output of EXOR GATE 610 is a logic 0. In this circumstance, the output of NAND GATE 611 is a logic 1, and the respective control signals G8, G4, G2, and G1 are logic 0's. EXOR GATE 610 is preferably a 74LS86.

Figure 5:
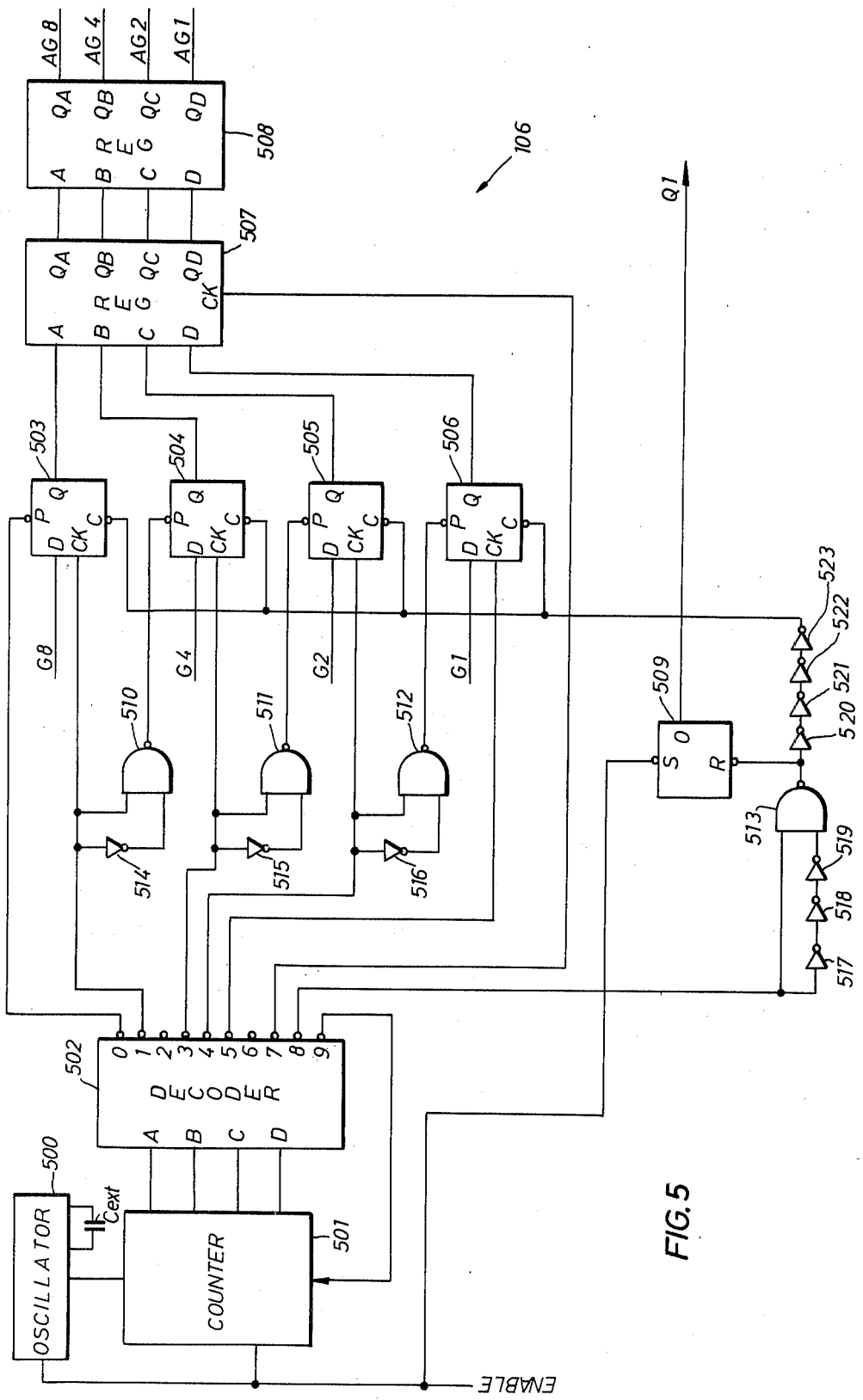
FIG. 5 is an electrical schematic diagram of the preferred embodiment of a major portion of the control circuitry of FIG. 1.

Now referring to FIG. 5, there is illustrated a major portion of control circuitry 106. As shown, this portion of control circuitry 106 comprises oscillator 500, counter 501, decoder 502, flip-flops 503–506, storage registers 507 and 508, flip-flop 509, NAND GATES 510–513, and inverters 514–523, all connected as shown.

Just prior to the beginning of a channel sample time, oscillator 500 and counter 501 are disabled, and each output of counter 501 is a logic 1. At the beginning of the channel sample time, the signal designated as ENABLE operates to reset the outputs of counter 501 to a logic 0 value and to enable oscillator 500. Also, the output of flip-flop 509, which is designated as Q1, is brought to a logic one value at this time, thereby enabling unity gain amplifier 450 (FIG. 4).

Oscillator 500 is preferably a voltage controlled oscillator, such as the 74S124 which is manufactured by Texas Instruments. Oscillator 500, when enabled, produces an output signal having a frequency given by the expression:

$$\frac{500}{C_{ext}(\text{in }pfd)} \text{ MHz.}$$

In the preferred embodiment of the present invention, $C_{ext}$ is 470 pfd, and oscillator 500 produces an output signal having a frequency of 1.0638 MHz.

Counter 501 operates in response to the output signal from oscillator 500 and increases the binary value of its output once every period of oscillator 500. Decoder 502 decodes the binary value of the outputs of counter 501, and produces output signals which are representative of this binary value. In the preferred embodiment of the instantaneous floating point amplifier of the present invention, counter 501 is a 74LS161 and decoder 502 is a 74LS42. The outputs of decoder 502 are connected to the various inputs of flip-flops 503–506 as shown, and each flip-flop 503–506 is preferably a 74LS74.

The operation of decoder 502 in the preferred embodiment of the present invention is such that each of its outputs is normally at a logic 1 level. The active state of each output of decoder 502 is a logic 0 level, and this active state occurs when the binary value of the outputs of counter 502 have a decimal value equal to the value shown at each of the outputs. For example, when the binary value of each output of counter 501 is a logic 0 value at the beginning at each channel sample time, output $\overline{0}$ of decoder 502 becomes active.

Flip-flop 503 responds to the active state of input $\overline{0}$ of decoder 502, and the logical value of the signal at its output, Q256, is brought to a logic 1 level. At this time, amplifier stage 150 (FIG. 1) is enabled, and the comparison process described above occurs.

Output $\overline{0}$ of decoder 502 remains active for one period of the output signal of oscillator 500, and during the next period of oscillator 500, output 1 is active. In the preferred embodiment of the present invention, the periods of time during which the $\overline{0}$ and $\overline{1}$ outputs of decoder 502 are active are sufficient for the above-described comparison process to take place to determine if amplifier stage 150 (FIG. 1) is required to amplify the input signal to a level within the preselected limits. Accordingly, the signal designated as G8 should, at the expiration of the periods of time that outputs $\overline{0}$ and $\overline{1}$ are active, have a logic value representative of whether amplifier stage 150 is required. At the end of the active interval of output 1, the logic value of signal G8 is clocked into flip-flop 503 and, therefore, the output of flip-flop 503 then corresponds to the value of signal G8. At the same time, NAND GATE 510 and inverter 514 operate to generate a signal, and flip-flop 504 responds to this signal by bringing its output, Q16, to a logic 1 level. The above-described comparison process is then repeated with the logic value of signal G4 determining the final state of flip-flop 504. Flip-flops 505 and 506 are then sequentially enabled in a similar manner, and a determination is made regarding whether amplifier stages 152 and 153, respectively, are required to amplify the input signal.

Now referring to both FIGS. 5 and 6, it will be appreciated by those skilled in the art that the voltage level set on the non-inverting inputs of comparator 600 and 601 (FIG. 6), together with the length of time that each control signal, Q256, Q16, Q4, and Q2, is active, determine the amount of time that the output of each amplifier stage 150–153 has to settle prior to it being determined that whether or not that stage is required to amplify the input signal. Accordingly, the frequency of oscillation of oscillator 500 (FIG. 5) or the length of time for comparison, as determined by the outputs of decoder 502 which are connected to flip-flops 503–506, may be varied depending upon the amount of settling time in the amplifier circuits that is required prior to a determination of whether an amplifier stage is required.

What is claimed is:

1. In an instantaneous floating point amplifier which amplifies the source signal to a level within preselected limits, said amplifier including n amplifier stages, and each of said amplifier stages having a gain, the improvement comprising:
   circuitry for producing $2^n$ combinations of gains from the n amplifier stages for application to the source signal by enabling those stages required to amplify said source signal and by bypassing those stages not required to amplify said source signal.

2. The instantaneous floating point amplifier of claim 1, wherein the gain of the amplifier stage having the least gain is $A_1$ and wherein the gains of the remaining stages are given by the expression: $A_i = [A_{i-1}]^2$, for $i = 2, 3, \ldots, n$.

3. The instantaneous floating point amplifier of claim 2, wherein it comprises four gain stages having gains of 2, 4, 16 and 256.

4. The instantaneous floating point amplifier of claim 1, wherein each amplifier stage comprises:
   a capacitor having one terminal thereof connected to the output of the amplifier stage; and
   a first switch connected to the input of the amplifier stage and a second switch connected to the second terminal of the capacitor, the closure of the first and second switches permitting the capacitor to charge to a voltage having a value equal to the offset voltage of the amplifier stage times the gain of the amplifier stage.

5. An instantaneous floating point amplifier having $2^n$ gain combinations for application to a source signal to amplify said source signal to a level within preselected limits, which comprises:

n amplifier stages, with each of said amplifier stages having a gain; circuitry for enabling each of said amplifier stages in a time-sequential manner;

a level detector having an input and an output, said input receiving a signal having a magnitude equal to the source signal times the gain of each enabled amplifier stage and said output producing a signal responsive to the magnitude of said input; and circuitry for generating signals responsive to the output signal of the level detector to retain an amplifier stage if it is required to amplify the source signal within the preselected limits and to bypass a stage if it is not required to amplify the source signal within the preselected limits.

6. The instantaneous floating point amplifier of claim 5, wherein $A_1$ is the gain of the amplifier stage having the least gain of the n stages and the gains of the remaining stages are given by the expression: $A_i = [A_{i-1}]^2$, for $i = 2, 3, \ldots, n$.

7. The instantaneous floating point amplifier of claim 6, wherein it comprises four amplifier stages having gains of 256, 16, 4 and 2.

8. The instantaneous floating point amplifier of claim 5, wherein each amplifier stage comprises:

a capacitor having one terminal thereof connected to the output of the amplifier stage; and a first switch connected to the input of the amplifier stage and a second switch connected to the second terminal of the capacitor, the closure of the first and second switches permitting the capacitor to charge to a voltage having a value equal to the offset voltage of the amplifier stage times the gain of the amplifier stage.

* * * * *

UNITED STATES PATENT OFFICE
CERTIFICATE OF CORRECTION

Patent No. 4,158,819          Dated    June 19, 1979

Inventor(s)   Miles A. Smither

It is certified that error appears in the above-identified patent and that said Letters Patent are hereby corrected as shown below:

In column 4, line 52, the word "to" should be --of--.

In column 4, line 58, after the word "foregoing", one of the commas should be deleted.

In column 6, line 32, the word --resistor-- is misspelled.

In column 8, line 31, insert the word --input-- after the word "inverting".

In column 10, line 1, "output 1" should read --output $\overline{1}$--.

In claim 5, lines 5-7 should read as follows:

--n amplifier stages, with each of said amplifier stages having a gain;

circuitry for enabling each of said amplifier stages in a time-sequential manner;--.

Signed and Sealed this

Twentieth Day of November 1979

[SEAL]

Attest:

RUTH C. MASON
*Attesting Officer*

LUTRELLE F. PARKER
*Acting Commissioner of Patents and Trademarks*